(12) United States Patent
Motallebi et al.

(10) Patent No.: US 8,643,200 B2
(45) Date of Patent: Feb. 4, 2014

(54) RESIN COMPOSITION AND TRANSPARENT ENCAPSULANT FORMED USING THE SAME, AND ELECTRONIC DEVICE INCLUDING THE ENCAPSULANT

(75) Inventors: Shahrokh Motallebi, Los Gatos, CA (US); Sina Maghsoodi, San Jose, CA (US); Changsoo Woo, Suwon-si (KR); Juneho Shin, Incheon (KR); Woo Han Kim, Kyungi-do (KR); Sangran Koh, Gwangmyeong-si (KR); Hyunjung Ahn, Gyeonggi-do (KR); Seunghwan Cha, Seoul (KR)

(73) Assignee: Cheil Indistries, Inc., Gumi-si, Kyeongsangbuk-do (KR)

( * ) Notice: Subject to any disclaimer, the term of this patent is extended or adjusted under 35 U.S.C. 154(b) by 179 days.

(21) Appl. No.: 13/106,353

(22) Filed: May 12, 2011

(65) Prior Publication Data

US 2011/0278640 A1 Nov. 17, 2011

Related U.S. Application Data

(60) Provisional application No. 61/344,041, filed on May 12, 2010.

(30) Foreign Application Priority Data

Sep. 14, 2010 (KR) .................. 10-2010-0089979
May 11, 2011 (KR) .................. 10-2011-0044204

(51) Int. Cl.
*H01L 23/29* (2006.01)

(52) U.S. Cl.
USPC ........... 257/791; 257/100; 257/787; 257/789; 257/795; 257/E23.12

(58) Field of Classification Search
USPC ................... 257/100, 431, 433, 787–795
See application file for complete search history.

(56) References Cited

U.S. PATENT DOCUMENTS

| | | | |
|---|---|---|---|
| 6,992,440 B2 | 1/2006 | Ishida | |
| 7,655,486 B2 | 2/2010 | Thompson | |
| 2005/0213926 A1* | 9/2005 | Tabei et al. .................. | 385/147 |
| 2006/0105483 A1 | 5/2006 | Leatherdale et al. | |
| 2008/0090986 A1 | 4/2008 | Khanarian et al. | |
| 2010/0276721 A1 | 11/2010 | Yoshitake et al. | |

FOREIGN PATENT DOCUMENTS

| | | | |
|---|---|---|---|
| WO | WO 2007/100445 A2 | 9/2007 | |
| WO | WO 2007/137006 A2 | 11/2007 | |

* cited by examiner

*Primary Examiner* — Mamadou Diallo
(74) *Attorney, Agent, or Firm* — Lee & Morse, P.C.

(57) ABSTRACT

An embodiment is directed to a polysiloxane having a moiety represented by the following Chemical Formula 1:

*—Si-AR—Si—* [Chemical Formula 1]

wherein, in the Chemical Formula 1, AR is or includes a substituted or unsubstituted C6 to C30 arylene group.

10 Claims, 1 Drawing Sheet

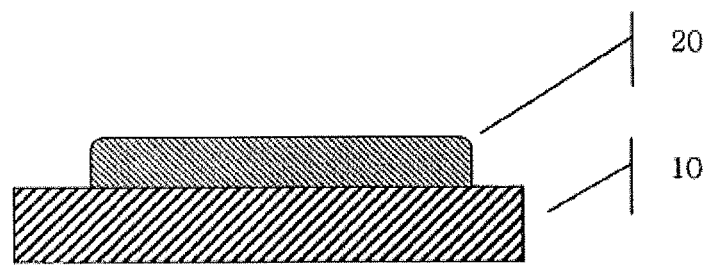

RESIN COMPOSITION AND TRANSPARENT ENCAPSULANT FORMED USING THE SAME, AND ELECTRONIC DEVICE INCLUDING THE ENCAPSULANT

The present application claims priority under 35 U.S.C. §119(e) to U.S. Provisional Application No. 61/344,041, filed on May 12, 2010, and entitled: "Transparent Resin Composition and Encapsulant Formed Using the Same, and Electronic Device including the Encapsulant," which is incorporated herein by reference in its entirety and for all purposes.

BACKGROUND OF THE INVENTION (a) Field of the Invention

This disclosure relates to a resin composition, a transparent encapsulant formed using the resin composition, and an electronic device including the encapsulant.

(b) Description of the Related Art

A light emitting and semiconducting element such as a light emitting diode (LED), Solar cell, an organic light emitting diode (OLED) device, and a photoluminescent (PL) device the like has been applied in the various fields, for example, a residential electric device, a lighting device, a display device, and an automation equipment. These light emitting and semiconducting elements are capable of expressing the inherent colors of the light emitting materials such as blue, red, and green and also expressing white color by associating the different color of each light emitting material.

SUMMARY OF THE INVENTION

An embodiment is directed to a polysiloxane having a moiety represented by the following Chemical Formula 1:

[Chemical Formula 1]

wherein, in the Chemical Formula 1, AR is or includes a substituted or unsubstituted C6 to C30 arylene group.

The polysiloxane may include a moiety represented by the following Chemical Formula 2a, a moiety represented by the following Chemical Formula 2b, and at least one of moieties represented by the following Chemical Formulae 2c, 2d, and 2e:

 [Chemical Formula 2a]

 [Chemical Formula 2b]

 [Chemical Formula 2c]

 [Chemical Formula 2d]

 [Chemical Formula 2e]

wherein, in the Chemical Formulae 2a to 2e, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d may independently be from 0 to 2, and c and e may independently be from 0 to 1.

The polysiloxane may be represented by the following Chemical Formula 3:

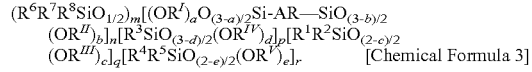
[Chemical Formula 3]

wherein, in the Chemical Formula 3, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, and m, n, p, q, and r may satisfy 0<m<0.9, 0<n<0.2, 0≤p<0.9, 0<q<0.9, and 0≤r<0.9, and m+n+p+q+r=1.

The polysiloxane may be included in about 50 wt % or more, based on the total amount of the transparent resin composition.

The polysiloxane may be included in about 50 to 99.9 wt %, based on the total amount of the transparent resin composition.

Another embodiment is directed to a transparent encapsulant obtained by curing a resin composition that includes a polysiloxane having a moiety represented by the following Chemical Formula 1:

 [Chemical Formula 1]

wherein, in the Chemical Formula 1, AR is or includes a substituted or unsubstituted C6 to C30 arylene group.

The polysiloxane may include a moiety represented by the following Chemical Formula 2a, a moiety represented by the following Chemical Formula 2b, and at least one of moieties represented by the following Chemical Formulae 2c, 2d, and 2e:

 [Chemical Formula 2a]

 [Chemical Formula 2b]

 [Chemical Formula 2c]

 [Chemical Formula 2d]

 [Chemical Formula 2e]

wherein in the Chemical Formulae 2a to 2e, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d may independently be from 0 to 2, and c and e may independently be from 0 to 1.

The polysiloxane may be represented by the following Chemical Formula 3:

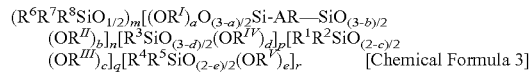
[Chemical Formula 3]

wherein in the Chemical Formula 3, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, and m, n, p, q, and r may satisfy 0<m<0.9, 0<n<0.2, 0≤p<0.9, 0<q<0.9 and 0≤r<0.9, and m+n+p+q+r=1.

Another embodiment is directed to an electronic device, including a light emitting and semiconducting element and a transparent encapsulant surrounding the light emitting element, wherein the encapsulant is obtained by curing a resin composition that includes a polysiloxane having a moiety represented by the following Chemical Formula 1:

  [Chemical Formula 1]

wherein, in the Chemical Formula 1, AR is or includes a substituted or unsubstituted C6 to C30 arylene group.

The polysiloxane may include a moiety represented by the following Chemical Formula 2a, a moiety represented by the following Chemical Formula 2b, and at least one of moieties represented by the following Chemical Formulae 2c, 2d, and 2e:

  [Chemical Formula 2a]

  [Chemical Formula 2b]

  [Chemical Formula 2c]

  [Chemical Formula 2d]

  [Chemical Formula 2e]

wherein in the Chemical Formulae 2a to 2e, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d may independently be from 0 to 2, and c and e may be from 0 to 1.

The polysiloxane may be represented by the following Chemical Formula 3:

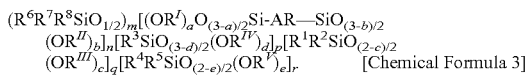  [Chemical Formula 3]

wherein, in the Chemical Formula 3, $R^I$ to $R^V$ may independently be hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, and m, n, p, q, and r may satisfy 0<m<0.9, 0<n<0.2, 0≤p<0.9, 0<q<0.9 and 0≤r<0.9, and m+n+p+q+r=1.

The electronic device may include at least one of a light emitting diode, an organic light emitting element, solar cell and a photoluminescent device.

BRIEF DESCRIPTION OF THE DRAWING

The above and other features and advantages will become more apparent to those of skill in the art by describing in detail example embodiments with reference to the attached drawing, in which:

FIG. 1 illustrates a view of an electronic device according to an example embodiment.

DETAILED DESCRIPTION

Korean Patent Application No. 10-2010-0089979, filed on Sep. 14, 2010, in the Korean Intellectual Property Office, and entitled: "Transparent Resin Composition and Encapsulant Formed Using the Same and Electronic Device Including the Encapsulant" and Korean Patent Application No. 10-2011-0044204, filed on May 11, 2011, in the Korean Intellectual Property Office, are incorporated by reference herein in their entirety.

Example embodiments will be described more fully hereinafter with reference to the accompanying drawings. This disclosure may, however, be embodied in many different forms and is not construed as limited to the example embodiments set forth herein.

As used herein, when a definition is not otherwise provided, the term "substituted" may refer to one substituted with at least a substituent selected from the group of halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, an carboxyl group or a salt thereof, a sulfonic acid group or a salt thereof, phosphoric acid or a salt thereof, a C1 to C30 alkyl group, a C2 to C16 alkenyl group, a C2 to C16 alkynyl group, a C6 to C30 aryl group, a C7 to C13 arylalkyl group, a C1 to C4 oxyalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a heterocycloalkyl group, and a combination thereof, instead of hydrogen.

As used herein, when a definition is not otherwise provided, the term "hetero" may refer to one including 1 to 3 heteroatoms selected from the group of N, O, S, and P.

Embodiments relate to a resin composition, a transparent encapsulant formed using the resin composition, e.g., an LED (light emitting diode) encapsulant, and an electronic device including the encapsulant, as well as associated methods.

Resin Composition

Hereinafter, a transparent resin composition, i.e., a resin composition that forms a transparent material, is described. The transparent resin composition may be a curable silicone composition.

Resin Composition—Polysiloxane

In an example embodiment, a component of the curable silicone composition is a diorganopolysiloxane copolymer (i.e., a polysiloxane) having terminals of the molecular chain end-blocked by a vinyl group. This component is used to adjust the viscosity of the final formulation, i.e., to adjust the viscosity of the transparent resin composition. Therefore, it is desirable that this component be available with different M.w. (molecular weight), viscosity vinyl content and hardness. Preferably, the vinyl content should be independently variable. As described herein, embodiments may provide for control of the M.w., viscosity vinyl content and hardness of new diorganopolysiloxane copolymers.

The polysiloxane according to an embodiment may have a weight average molecular weight of about 800 g/mol to about 100,000 g/mol. In an implementation, the polysiloxane may have a weight average molecular weight of about 3,000 to about 15,000 g/mol.

The polysiloxane may be included in an amount of about 50 wt % or more, based on the total amount of the transparent resin composition. In an implementation, the polysiloxane may be included in an amount of about 50 wt % to about 99.9 wt %, based on the total amount of the transparent resin composition.

In an example embodiment, the diorganopolysiloxane copolymer includes a moiety represented by Chemical Formula 1, below. For example, a small quantity of a hexafunctional arylene silyl monomer may be used. Embodiments of the present invention may provide a wide range of functional copolymers with different M.w., while also providing for increases in the viscosity and particularly the vinyl content of the final copolymer.

[Chemical Formula 1]:

In an implementation, AR in Chemical Formula 1 may be a substituted or unsubstituted C6 to C30 arylene group. In an implementation, AR in Chemical Formula 1 may include a substituted or unsubstituted C6 to C30 arylene group, and may be a group such as:

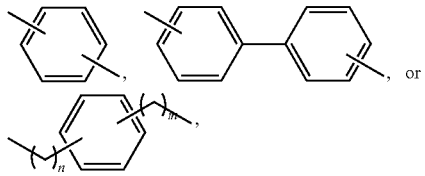

where n=1 to 10 and m=1 to 10.

The polysiloxane may include a moiety represented by the following Chemical Formula 2a (corresponding to Formula 1); a moiety represented by the following Chemical Formula 2b; and at least one of moieties represented by the following Chemical Formula 2c, 2d and 2e:

 [Chemical Formula 2a]:

 [Chemical Formula 2b]:

 [Chemical Formula 2c]:

 [Chemical Formula 2d]:

 [Chemical Formula 2e]:

In the Chemical Formulae 2a to 2e, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d are independently from 0 to 2, and c and e are independently from 0 to 1.

As but one example, the polysiloxane may be represented by the following Chemical Formula 3:

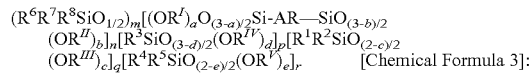 [Chemical Formula 3]:

In the Chemical Formula 3, $R^1$ to $R^8$, $R^I$ to $R^V$, a to e, and AR are the same as defined above. Also, m, n, p, q, and r may satisfy: $0<m<0.9$, $0<n<0.2$, $0\leq p<0.9$, $0<q<0.9$, and $0\leq r<0.9$, and $m+n+p+q+r=1$.

The polysiloxane may be obtained by polymerizing a silyl monomer having an arylene group (the silyl monomer corresponding to Chemical Formula 1) with a silicon monomer and an end-capping reagent.

The silyl monomer having the arylene group and the silicon monomer may be included in an amount of about 0.01 to 20 wt % and about 80 to 99.9 wt %, respectively.

Polysiloxane—Silyl Monomer Having an Arylene Group

The silyl monomer having the arylene group may be represented by, for example, the following Chemical Formula 4.

 [Chemical Formula 4]

In the Chemical Formula 4, AR may be, or may include, a substituted or unsubstituted C6 to C30 arylene group. In the Chemical Formula 4, each $X^1$ may independently be a C1 to C6 alkoxy group, a hydroxyl group, a halogen, or a carboxyl group; a combination thereof may be used for $(X^1)_3$. In the Chemical Formula 4, each $X^2$ may independently be a C1 to C6 alkoxy group, a hydroxyl group, a halogen, or a carboxyl group; a combination thereof may be used for $(X^2)_3$.

Polysiloxane—Silicon Monomer

The silicon monomer may be at least one selected from compounds represented by, for example, the following Chemical Formula 5, the following Chemical Formula 6, and the following Chemical Formula 7.

 [Chemical Formula 5]:

 [Chemical Formula 6]:

 [Chemical Formula 7]:

In the Chemical Formula 5 to 7, $R^{14}$ to $R^{16}$ are respectively bonded to a silicon atom and may independently be hydrogen, a substituted or unsubstituted C1 to C6 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C6 alkoxy group, a substituted or unsubstituted carbonyl group, or a hydroxy group.

In the Chemical Formula 5 to 7, and $X^3$ to $X^{11}$ are respectively bonded to a silicon atom and may independently be a C1 to C6 alkoxy group, a hydroxy group, a halogen, or a carboxyl group.

Polysiloxane—End-Capping Reagent

After the silyl monomer having the arylene group and the silicon monomer are polymerized, an end-capping reagent may be added. The end-capping reagent may be a silicon compound. For example, the end-capping reagent may be 1,3-divinyl-1,1,3,3-tetramethyldisiloxane, 1,3-diallyl-1,1,3, 3-tetramethyldisiloxane, 1,3-divinyl-1,1,3,3-tetraphenyldisiloxane, 1,3-divinyl-1,3-dimethyl-1,3-diphenyldisiloxane, vinyldimethylchlorosilane, vinyldiphenylchlorosilane, vinylphenylmethylchlorosilane, vinyldimethylethoxysilane, vinyldiphenylethoxysilane, vinylphenylmethylmethoxysilane, or a combination thereof.

The following are particular examples corresponding to the above-described Chemical Formulae 2a-2e: for Chemical Formula 2a: 1,4-bis(triethoxysilyl)benzene and bis(trimethoxysilylethyl)benzene; for Chemical Formula 2b: phenylmethyldimethoxysilane; for Chemical Formula 2c: phenyltrimethoxysilane and methyltrimethoxysilane; for Chemical Formula 2d: methylvinyldimethoxysilane; for Chemical Formula 2e: 1,3-divinyltetramethyldisiloxane.

Resin Composition—Hydrosilylation Catalyst

The transparent resin composition for an encapsulant according to an embodiment may further include a hydrosilylation catalyst, in addition to the polysiloxane. The hydrosilylation catalyst may include, for example, platinum, rhodium, palladium, ruthenium, iridium, or a combination thereof. The hydrosilylation catalyst may be included in about 0.1 ppm to about 1,000 ppm, based on the total amount of transparent resin composition.

Resin Composition—Polyorganosiloxane

The transparent resin composition may further include a polyorganosiloxane represented by the following Chemical Formula 8.

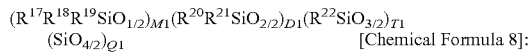
[Chemical Formula 8]:

In the Chemical Formula 8, $R^{17}$ to $R^{22}$ may independently be hydrogen, a substituted or unsubstituted C1 to C6 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C6 alkoxy group, a substituted or unsubstituted carbonyl group, a hydroxy group, or a combination thereof. In the Chemical Formula 8, M1, D1, T1, and Q1 may satisfy: $0<M1<1$, $0 \le D1<1$, $0 \le T1<1$, $0 \le Q1<1$, and $M1+D1+T1+Q1=1$, where M1, D1, T1, and Q1 each refer to mole fraction.

The polyorganosiloxane may be included in an amount of, e.g., less than about 50 wt %, based on the total amount of the transparent resin composition.

Resin Composition—Adhesion Promoter

The transparent resin composition may further include an adhesion promoter. The adhesion promoter may include, for example, glycidoxypropyltrimethoxysilane, vinyltriethoxysilane, glycidoxypropyltriethoxysilane, or the like.

Encapsulant

According to another aspect, provided is an encapsulant obtained by curing the transparent resin composition.

The encapsulant may be obtained by curing the transparent resin composition including the polysiloxane having a moiety represented by the following Chemical Formula 1.

[Chemical Formula 1]:

In the Chemical Formula 1, AR may be, or may include, a substituted or unsubstituted C6 to C30 arylene group.

As described above, the polysiloxane may include a moiety represented by the following Chemical Formula 2a; a moiety represented by the following Chemical Formula 2b; and at least one of moieties represented by the following Chemical Formulae 2c, 2d, and 2e.

[Chemical Formula 2a]:

[Chemical Formula 2b]:

[Chemical Formula 2c]:

[Chemical Formula 2d]:

[Chemical Formula 2e]:

For example, the polysiloxane may be represented by the following Chemical Formula 3.

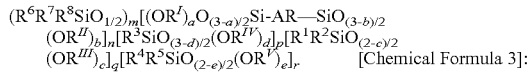
[Chemical Formula 3]:

In the Chemical Formulae 2a to 2e and Chemical Formula 3, $R^I$ to $R^V$, $R^1$ to $R^8$, AR, a, b, c, d, e, m, n, p, q, and r are the same as defined above.

Electronic Device

According to another aspect, an electronic device is provided that includes a light emitting and semiconducting element and a transparent encapsulant surrounding the light emitting element.

The encapsulant may be obtained by curing the transparent resin compound according to an embodiment, the resin composition including a polysiloxane having a moiety represented by the following Chemical Formula 1.

[Chemical Formula 1]:

In the Chemical Formula 1, AR may be, or may include, a substituted or unsubstituted C6 to C30 arylene group.

As described above, the polysiloxane may include a moiety represented by the following Chemical Formula 2a; a moiety represented by the following Chemical Formula 2b; and at least one of moieties represented by the following Chemical Formulae 2c, 2d, and 2e.

[Chemical Formula 2a]:

[Chemical Formula 2b]:

[Chemical Formula 2c]:

[Chemical Formula 2d]:

[Chemical Formula 2e]:

For example, the polysiloxane may be represented by the following Chemical Formula 3.

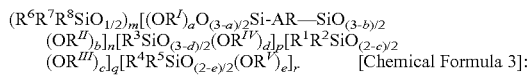
[Chemical Formula 3]:

In the Chemical Formula 2a to 2e and Chemical Formula 3, $R^I$ to $R^V$, $R^1$ to $R^8$, AR, a, b, c, d, e, m, n, p, q, and r are the same as defined above.

The electronic device may include, for example, a light emitting diode, an organic light emitting device, a photoluminescent device, and a solar cell, but is not limited thereto.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of Polysiloxane

Synthesis Example 1

In a 3 L jacketed reactor equipped with a mechanical stirrer, a condenser and an additional funnel, phenylmethyldimethoxysilane (1822.5 g, 9.998 moles (silicon monomer)) and 1,4-bis(triethoxysilyl)benzene (0.84 g, 0.002 moles (hexafunctional arylene silyl monomer)) were added at room temperature (25° C.). TMAH (25% solution in water, 0.46 g, 0.005 moles) was added over 10 min with stirring at 25° C. The mixture was then heated to 50° C. and water (180 g, 10 moles) was added over 120 min. The mixture was then heated at 65° C. for 5 hours and then cooled to room temperature. The resulting mixture was neutralized with acetic acid and washed with water. The resulting polymer was dried under vacuum and then 1,3-divinyltetramethyldisiloxane (i.e., $[H_2C{=}CHSi(CH_3)_2]_2O$) (372.8 g, 2 moles (end-capping reagent)) and sulfuric acid (95-98%, 10 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 9. In Chemical Formula 9, Me is a methyl group, Ph is a phenyl group, Vi is a vinyl group, Si is silicon, and O is oxygen.

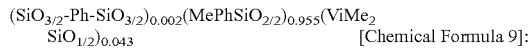   [Chemical Formula 9]:

Synthesis Example 2

In a 3 L jacketed reactor equipped with a mechanical stirrer, a condenser and an additional funnel, phenylmethyldimethoxysilane (1821.9 g, 9.995 moles) and 1,4-bis(triethoxysilyl)benzene (2.1 g, 0.005 moles) were added at room temperature (25° C.). TMAH (25% solution in water, 0.46 g, 0.005 moles) was added over 10 min with stirring at 25° C. The mixture was then heated to 50° C. and water (180 g, 10 moles) was added over 120 min. The mixture was then heated at 65° C. for 5 hours and then cooled to room temperature. The resulting mixture was neutralized with acetic acid and washed with water. The resulting polymer was dried under vacuum and then 1,3-divinyltetramethyldisiloxane (372.8 g, 2 moles) and sulfuric acid (95-98%, 10 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 10. In Chemical Formula 10, Me is a methyl group, Ph is a phenyl group, Vi is a vinyl group, Si is silicon, and O is oxygen.

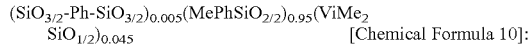   [Chemical Formula 10]:

Synthesis Example 3

In a 3 L jacketed reactor equipped with a mechanical stirrer, a condenser and an additional funnel, phenylmethyldimethoxysilane (1821.0 g, 9.99 moles) and 1,4-bis(triethoxysilyl)benzene (4.2 g, 0.01 moles) were added at room temperature (25° C.). TMAH (25% solution in water, 0.46 g, 0.005 moles) was added over 10 min with stirring at 25° C. The mixture was then heated to 50° C. and water (180 g, 10 moles) was added over 120 min. The mixture was then heated at 65° C. for 5 hours and then cooled to room temperature. The resulting mixture was neutralized with acetic acid and washed with water. The resulting polymer was dried under vacuum and then 1,3-divinyltetramethyldisiloxane (372.8 g, 2 moles) and sulfuric acid (95-98%, 10 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 11, wherein Me is a methyl group, Ph is a phenyl group, Vi is a vinyl group, Si is silicon, and O is oxygen.

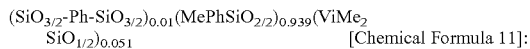   [Chemical Formula 11]:

Synthesis Example 4

In a 3 L jacketed reactor equipped with a mechanical stirrer, a condenser and an additional funnel, phenylmethyldimethoxysilane (1820.0 g, 9.985 moles) and 1,4-bis(triethoxysilyl)benzene (6.3 g, 0.015 moles) were added at room temperature (25° C.). TMAH (25% solution in water, 0.46 g, 0.005 mmoles) was added over 10 min with stirring at 25° C. The mixture was then heated to 50° C. and water (180 g, 10 moles) was added over 120 min. The mixture was then heated at 65° C. for 5 hours and then cooled to room temperature. The resulting mixture was neutralized with acetic acid and washed with water. The resulting polymer was dried under vacuum and then 1,3-divinyltetramethyldisiloxane (372.8 g, 2 moles) and sulfuric acid (95-98%, 10 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 12, wherein Me is a methyl group, Ph is a phenyl group, Vi is a vinyl group, Si is silicon, and O is oxygen.

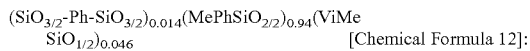   [Chemical Formula 12]:

Synthesis Example 5

In a 3 L jacketed reactor equipped with a mechanical stirrer, a condenser and an additional funnel, phenylmethyldimethoxysilane (1093.0 g, 6.00 moles) and 1,4-bis(trimethoxysilylethyl)benzene (5.82 g, 0.015 moles) were added at room temperature (25° C.). KOH (25% solution in water, 0.17 g, 0.003 moles) was added over 10 min with stirring at 25° C. The mixture was then heated to 50° C. and water (108 g, 6.02 moles) was added over 120 min. The mixture was then heated at 65° C. for 5 hours and then cooled to room temperature. The resulting polymer was dried under vacuum and then 1,3-divinyltetramethyldisiloxane (226.8 g, 1.2 moles) and sulfuric acid (95-98%, 6.0 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 13, wherein Me is a methyl group, Ph is a phenyl group, Vi is a vinyl group, Si is silicon, and O is oxygen.

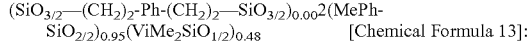   [Chemical Formula 13]:

Synthesis Example 6

In a 3 L jacketed reactor equipped with a mechanical stirrer, a condenser and an additional funnel, phenylmethyldimethoxysilane (1093.0 g, 6.00 moles) and 1,4-bis(trimethoxysilylethyl)benzene (11.24 g, 0.03 moles) were added at room temperature (25° C.). KOH (25% solution in water, 0.17 g, 0.003 moles) was added over 10 min with stirring at 25° C. The mixture was then heated to 50° C. and water (108 g, 6.02 moles) was added over 120 min. The mixture was then heated at 65° C. for 5 hours and then cooled to room temperature. The resulting polymer was dried under vacuum and then 1,3-divinyltetramethyldisiloxane (226.8 g, 1.2 mmoles) and sulfuric acid (95-98%, 6.0 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 14, wherein Me is a methyl group, Ph is a phenyl group, Vi is a vinyl group, Si is silicon, and O is oxygen.

$(SiO_{3/2}—(CH_2)_2\text{-}Ph\text{-}(CH_2)_2—SiO_{3/2})_{0.005}(MePh\ SiO_{2/2})_{0.955}(ViMe_2SiO_{1/2})_{0.04}$      [Chemical Formula 14]:

Synthesis Example 7

In a 3 L jacketed reactor equipped with a mechanical stirrer, a condenser and an additional funnel, phenylmethyldimethoxysilane (1093.0 g, 6.00 moles) and 1,4-bis(trimethoxysilylethyl)benzene (22.47 g, 0.06 moles) were added at room temperature (25° C.). KOH (25% solution in water, 0.17 g, 0.003 moles) was added over 10 min with stirring at 25° C. The mixture was then heated to 50° C. and water (108 g, 6.02 moles) is added over 120 min. The mixture was then heated at 65° C. for 5 hours and then cooled to room temperature. The resulting polymer was dried under vacuum and then 1,3-divinyltetramethyldisiloxane (226.8 g, 1.2 moles) and sulfuric acid (95-98%, 6.0 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 15, wherein Me is a methyl group, Ph is a phenyl group, Vi is a vinyl group, Si is silicon, and O is oxygen.

$(SiO_{3/2}—(CH_2)_2\text{-}Ph\text{-}(CH_2)_2—SiO_{3/2})_{0.01}(MePh\ SiO_{2/2})_{0.945}(ViMe_2SiO_{1/2})_{0.45}$      [Chemical Formula 15]:

Synthesis Example 8

In a 3 L jacketed reactor equipped with a mechanical stirrer, a condenser and an additional funnel, phenylmethyldimethoxysilane (1093.0 g, 6.00 moles) and 1,4-bis(trimethoxysilylethyl)benzene (33.71, 0.09 moles) were added at room temperature (25° C.). KOH (25% solution in water, 0.17 g, 0.003 moles) was added over 10 min with stirring at 25° C. The mixture was then heated to 50° C. and water (108 g, 6.02 moles) was added over 120 min. The mixture was then heated at 65° C. for 5 hours and then cooled to room temperature. The resulting polymer was dried under vacuum and then 1,3-divinyltetramethyldisiloxane (226.8 g, 1.2 moles) and sulfuric acid (95-98%, 6.0 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 16, wherein Me is a methyl group, Ph is a phenyl group, Vi is a vinyl group, Si is silicon, and O is oxygen.

$(SiO_{3/2}—(CH_2)_2\text{-}Ph\text{-}(CH_2)_2—SiO_{3/2})_{0.014}(MePh\ SiO_{2/2})_{0.936}(ViMe_2SiO_{1/2})_{0.05}$      [Chemical Formula 16]:

Synthesis Example 9

In a 3 L jacketed reactor equipped with a mechanical stirrer, a condenser and an additional funnel, phenylmethyldimethoxysilane (1093.0 g, 6.00 moles) and 1,4-bis(trimethoxysilylethyl)benzene (44.95 g, 0.12 moles) were added at room temperature (25° C.). KOH (25% solution in water, 0.17 g, 0.003 moles) was added over 10 min with stirring at 25° C. The mixture was then heated to 50° C. and water (108 g, 6.02 moles) was added over 120 min. The mixture was then heated at 65° C. for 5 hours and then cooled to room temperature. The resulting polymer was dried under vacuum and then 1,3-divinyltetramethyldisiloxane (226.8 g, 1.2 moles) and sulfuric acid (95-98%, 6.0 g) were added and the mixture was stirred for 12 h at room temperature. The mixture was then washed with water and volatiles removed under reduced pressure to yield the desired polymer.

The polysiloxane structure was confirmed using H-NMR, Si-NMR, and an elemental analysis, and is represented by Chemical Formula 17, wherein Me is a methyl group, Ph is a phenyl group, Vi is a vinyl group, Si is silicon, and O is oxygen.

$(SiO_{3/2}—(CH_2)_2\text{-}Ph\text{-}(CH_2)_2—SiO_{3/2})_{0.02}(MePh\ SiO_{2/2})_{0.935}(ViMe_2SiO_{1/2})_{0.045}$      [Chemical Formula 17]:

Comparative Synthesis Example 1

Polysiloxane was prepared in accordance with the same procedure as in Synthesis Example 1, except that phenylmethyldimethoxysilane and divinyltetramethyldisiloxane were mixed at a mole ratio of 96.9:3.1 without using 1,4-bis(triethoxysilyl)benzene.

The polysiloxane structure was confirmed using H-NMR, Si-NMR, and an elemental analysis, and is represented by Chemical Formula 18, wherein Me is a methyl group, Ph is a phenyl group, Vi is a vinyl group, Si is silicon, and O is oxygen.

$(MePhSiO_{2/2})_{0.969}(ViMe_2SiO_{1/2})_{0.031}$      [Chemical Formula 18]:

Comparative Synthesis Example 2

Polysiloxane was prepared in accordance with the same procedure as in Synthesis Example 1, except that phenylmethyldimethoxysilane and divinyltetramethyl disiloxane were mixed at a mole ratio of 97.3:2.7 without using 1,4-bis (triethoxysilyl)benzene.

The polysiloxane structure was confirmed using H-NMR, Si-NMR, and an elemental analysis, and is represented by Chemical Formula 19, wherein Me is a methyl group, Ph is a phenyl group, Vi is a vinyl group, Si is silicon, and O is oxygen.

$(MePhSiO_{2/2})_{0.973}(ViMe_2SiO_{1/2})_{0.027}$      [Chemical Formula 19]:

Comparative Synthesis Example 3

Polysiloxane was prepared in accordance with the same procedure as in Synthesis Example 1, except that phenylmethyldimethoxysilane and divinyltetramethyl disiloxane were mixed at a mole ratio of 97.6:2.4 without using 1,4-bis(triethoxysilyl)benzene.

The polysiloxane structure was confirmed using H-NMR, Si-NMR, and an elemental analysis, and is represented by Chemical Formula 20, wherein Me is a methyl group, Ph is a phenyl group, Vi is a vinyl group, Si is silicon, and O is oxygen.

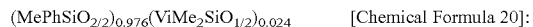

$(MePhSiO_{2/2})_{0.976}(ViMe_2SiO_{1/2})_{0.024}$  [Chemical Formula 20]:

Comparative Synthesis Example 4

Polysiloxane was prepared in accordance with the same procedure as in Synthesis Example 1, except that phenylmethyldimethoxysilane and divinyltetramethyl disiloxane were mixed at a mole ratio of 98.0:2.0 without using 1,4-bis(triethoxysilyl)benzene.

The polysiloxane structure was confirmed using H-NMR, Si-NMR, and an elemental analysis, and is represented by Chemical Formula 21, wherein Me is a methyl group, Ph is a phenyl group, Vi is a vinyl group, Si is silicon, and O is oxygen.

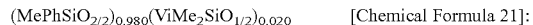

$(MePhSiO_{2/2})_{0.980}(ViMe_2SiO_{1/2})_{0.020}$  [Chemical Formula 21]:

Physical Property of Polysiloxane

Each polysiloxane obtained from Synthesis Examples 1 to 9 and Comparative Synthesis Examples 1 to 4 was measured to determine a molecular weight and a viscosity of polysiloxane and a vinyl group amount in the structure. The molecular weight was measured using a gel permeation chromatography; the viscosity was measured using Brookfield viscometer; the vinyl group equivalent in the structure was measured using $^1$H NMR.

The results are shown in Table 1:

TABLE 1

|  | Molecular weight (Mw) | Viscosity (25° C., cP) | Vinyl group equivalent (mmol/g) |
| --- | --- | --- | --- |
| Synthesis Example 1 | 7,709 | 7,742 | 0.51 |
| Synthesis Example 2 | 8,238 | 9,963 | 0.53 |
| Synthesis Example 3 | 9,462 | 11,327 | 0.60 |
| Synthesis Example 4 | 11,161 | 14,470 | 0.54 |
| Synthesis Example 5 | 5,057 | 3,205 | 0.56 |
| Synthesis Example 6 | 6,195 | 6,390 | 0.47 |
| Synthesis Example 7 | 7,177 | 8,100 | 0.53 |
| Synthesis Example 8 | 8,133 | 8,900 | 0.59 |
| Synthesis Example 9 | 10,945 | 19,053 | 0.54 |
| Comparative Synthesis Example 1 | 7,000 | 6,000 | 0.286 |
| Comparative Synthesis Example 2 | 8,000 | 7,200 | 0.250 |
| Comparative Synthesis Example 3 | 9,000 | 8,500 | 0.222 |
| Comparative Synthesis Example 4 | 11,000 | 10,000 | 0.182 |

Referring to Table 1, each polysiloxane obtained from Synthesis Examples 1 to 8 had a uniform vinyl group equivalent, regardless of the molecular weight; on the other hand, each polysiloxane obtained from Comparative Synthesis Examples 1 to 4 had a varied vinyl group equivalent depending upon increasing the molecular weight. Accordingly, it can be seen that, according to an embodiment, the viscosity of polysiloxane may be controlled by changing the molecular weight without a reduction of vinyl group equivalent.

Preparing Transparent Resin Composition—1

Example 1

90 parts by weight of polysiloxane obtained from Synthesis Example 1 and 10 parts by weight of vinyl-capped polyphenylsilsequioxane (vinyl group amount: 1.000 mmol/g) were mixed and added with hydrogen capped polyphenylmethylsiloxane (hydrogen amount: 5.0 mmol/g) to maintain the ratio of hydrogen and vinyl group (H/Vi) at 1.00. Then it was defoamed under vacuum to provide a liquid resin composition.

Example 2

A liquid resin composition was prepared in accordance with the same procedure as in Example 1, except that polysiloxane obtained from Synthesis Example 2 was used instead of polysiloxane obtained from Synthesis Example 1.

Example 3

A liquid resin composition was prepared in accordance with the same procedure as in Example 1, except that polysiloxane obtained from Synthesis Example 3 was used instead of polysiloxane obtained from Synthesis Example 1.

Example 4

A liquid resin composition was prepared in accordance with the same procedure as in Example 1, except that polysiloxane obtained from Synthesis Example 4 was used instead of polysiloxane obtained from Synthesis Example 1.

Comparative Example 1

A liquid resin composition was prepared in accordance with the same procedure as in Example 1, except that polysiloxane obtained from Comparative Synthesis Example 1 was used instead of polysiloxane obtained from Synthesis Example 1.

Comparative Example 2

A liquid resin composition was prepared in accordance with the same procedure as in Example 1, except that polysiloxane obtained from Comparative Synthesis Example 2 was used instead of polysiloxane obtained from Synthesis Example 1.

Comparative Example 3

A liquid resin composition was prepared in accordance with the same procedure as in Example 1, except that polysiloxane obtained from Comparative Synthesis Example 3 was used instead of polysiloxane obtained from Synthesis Example 1.

Comparative Example 4

A liquid resin composition was prepared in accordance with the same procedure as in Example 1, except that polysiloxane obtained from Comparative Synthesis Example 4 was used instead of polysiloxane obtained from Synthesis Example 1.

Physical Property of Transparent Resin Composition—1

Table 2 shows the amounts of hydrogen-capped polyphenylmethylsiloxane (HC-PS) that was added for maintaining the ratio of hydrogen to vinyl group (HNi) at 1.00 in each resin composition obtained from Examples 1 to 4 and Comparative Examples 1 to 4.

TABLE 2

|  | HC-PS (parts by weight) |
| --- | --- |
| Example 1 | 8.03 |
| Example 2 | 8.03 |
| Example 3 | 8.03 |
| Example 4 | 8.03 |
| Comparative Example 1 | 7.15 |
| Comparative Example 2 | 6.50 |
| Comparative Example 3 | 6.00 |
| Comparative Example 4 | 5.28 |

In addition, Table 3 shows the hardness and the viscosity of each resin composition obtained from Examples 1 to 4 and Comparative Examples 1 to 4. The hardness was measured in accordance with Shore-A type durometer, and the viscosity was measured according to Brookfield viscometer.

TABLE 3

|  | Hardness (Shore A) | Viscosity (cP) |
| --- | --- | --- |
| Example 1 | 50 | 1,500 |
| Example 2 | 50 | 1,850 |
| Example 3 | 51 | 2,130 |
| Example 4 | 51 | 2,420 |
| Comparative Example 1 | 48 | 1,700 |
| Comparative Example 2 | 43 | 1,800 |
| Comparative Example 3 | 41 | 1,820 |
| Comparative Example 4 | 39 | 2,000 |

As shown in Table 2 and Table 3, when the resin compositions obtained from Examples 1 to 4 maintained the ratio of hydrogen to vinyl group (HNi) at 1.00, the amount of hydrogen-capped polyphenylmethylsiloxane was uniform; on the other hand, in the resin compositions obtained from Comparative Examples 1 to 4, the amount of hydrogen-capped polyphenylmethylsiloxane was decreased.

In addition, in the resin compositions obtained from Examples 1 to 4, the hardness was almost uniform, and the viscosity was almost uniformly increased; on the other hand, in the resin compositions obtained from Comparative Examples 1 to 4, the hardness was deteriorated, and the viscosity was irregularly increased.

Thereby, it is understood that, according to an embodiment, the viscosity was be controlled in the resin compositions obtained from Examples; on the other hand, the viscosity is not easily controlled in the resin compositions obtained from Comparative Examples.

Preparing Transparent Resin Composition—2

Example 5

90 parts by weight of polysiloxane obtained from Synthesis Example 1, 10 parts by weight of vinyl-capped polyphenylsilsequioxane (vinyl group amount: 1.000 mmol/g), and 8.03 parts by weight of hydrogen-capped polyphenylmethylsiloxane (hydrogen amount: 5.0 mmol/g) were mixed and defoamed under vacuum to provide a liquid resin composition.

Example 6

A liquid resin composition was prepared in accordance with the same procedure as in Example 5, except that polysiloxane obtained from Synthesis Example 2 was used instead of polysiloxane obtained from Synthesis Example 1.

Example 7

A liquid resin composition was prepared in accordance with the same procedure as in Example 5, except that polysiloxane obtained from Synthesis Example 3 was used instead of polysiloxane obtained from Synthesis Example 1.

Example 8

A liquid resin composition was prepared in accordance with the same procedure as in Example 5, except that polysiloxane obtained from Synthesis Example 4 was used instead of polysiloxane obtained from Synthesis Example 1.

Comparative Example 5

A liquid resin composition was prepared in accordance with the same procedure as in Example 5, except that polysiloxane obtained from Comparative Synthesis Example 1 was used instead of polysiloxane obtained from Synthesis Example 1.

Comparative Example 6

A liquid resin composition was prepared in accordance with the same procedure as in Example 5, except that polysiloxane obtained from Comparative Synthesis Example 2 was used instead of polysiloxane obtained from Synthesis Example 1.

Comparative Example 7

A liquid resin composition was prepared in accordance with the same procedure as in Example 5, except that polysiloxane obtained from Comparative Synthesis Example 3 was used instead of polysiloxane obtained from Synthesis Example 1.

Comparative Example 8

A liquid resin composition was prepared in accordance with the same procedure as in Example 5, except that polysiloxane obtained from Comparative Synthesis Example 4 was used instead of polysiloxane obtained from Synthesis Example 1.

Physical Property of Transparent Resin Composition—2

Each resin composition obtained from Examples 5 to 8 and Comparative Examples 5 to 8 was measured to determine a ratio of hydrogen to vinyl group (H/Vi), hardness, viscosity, and heat resistance. The hardness was measured in accordance with a Shore-A type durometer, and the viscosity was measured according to a Brookfield viscometer. The heat resistance was estimated with the amount of reduction in transmittance of the each resin composition in a liquid phase prepared in Examples 1 to 5 when the resin composition was heated at 150° C. for 1,000 hrs. The transmittance (T (%)) was measured at a wavelength of 450 nm according to a UV-spectrophotometer (Shimadzu, UV-3600).

The results are shown in Table 4:

TABLE 4

|  | H/Vi | Hardness (Shore A) | Viscosity (cP) | T(%)@450 nm 0 hrs@ 150° C. | T(%)@450 nm 1,000 hrs @ 150° C. |
| --- | --- | --- | --- | --- | --- |
| Example 5 | 1.00 | 50 | 1,500 | 98.3% | 94.1% |
| Example 6 | 1.00 | 50 | 1,850 | 98.2% | 94.0% |
| Example 7 | 1.00 | 51 | 2,130 | 98.3% | 93.5% |
| Example 8 | 1.00 | 51 | 2,420 | 98.0% | 93.0% |
| Comparative Example 5 | 1.12 | 53 | 1,310 | 98.0% | 90.3% |
| Comparative Example 6 | 1.24 | 56 | 1,400 | 97.8% | 89.5% |
| Comparative Example 7 | 1.34 | 59 | 1,750 | 97.7% | 85.3% |
| Comparative Example 8 | 1.52 | 65 | 2,020 | 97.7% | 82.1% |

As shown in Table 4, the resin compositions obtained from Examples 5 to 8 had a predetermined ratio of hydrogen to vinyl group (H/Vi) with respect to the predetermined amount of hydrogen-capped polyphenylmethylsiloxane; on the other hand, the resin compositions obtained from Comparative Examples 5 to 8 had a varied ratio of hydrogen to vinyl group ratio (H/Vi). The ratio of hydrogen to vinyl group ratio (H/Vi) is a factor determining the physical property such as hardness and modulus after curing process. In the resin compositions obtained from Examples 5 to 8, the physical properties were easily controlled; on the other hand, in the resin compositions obtained from Comparative Examples 5 to 8, the physical properties were not easily controlled.

In addition, it is understood that, in the resin compositions obtained from Examples 5 to 8, the hardness was almost uniform, and the viscosity was almost uniformly increased; on the other hand, in the resin compositions obtained from Comparative Examples 5 to 8, the hardness was irregularly changed, and the viscosity was irregularly increased. Accordingly, it is also anticipated that the resin compositions obtained from Examples 5 to 8 may maintain the uniform hardness and easily control the viscosity compared to the resin compositions obtained from Comparative Examples 5 to 8.

Regarding the heat resistance, the transmittance (T (%)) was measured after the resin compositions had been heated at 150° C. for 1,000 hrs and was compared with the transmittance (T (%)) of the initial resin composition before heating. The resin compositions of Examples 5 to 8 indicated less than 5% reduction in the transmittance and showed less yellowing after the long time exposure to high temperature, while the resin compositions Comparative Examples 5 to 8 indicated 8-15% reduction. Accordingly, the resin compositions of Examples 5 to 8 maintained the initial transmittance and thus the resin compositions of Examples 5 to 8 had good heat resistance.

The light emitting and semiconducting element is provided in a packaging or an encapsulating structure. The packaging or encapsulating structure may include an encapsulant capable of transmitting light emitted from the light emitting material into the outside, and the encapsulant may be formed of a transparent resin composition. For example, referring to FIG. 1, the light emitting and semiconducting element may be provided in a packaging or encapsulating structure 20 that is disposed on a substrate 10, which may be opaque, reflective, transparent, semi-transparent, etc.

As described above, embodiments may provide a silicon-containing encapsulant, which may be used for, e.g., a light emitting diode (LED), and which may be formed using a curable organopolysiloxane composition. Embodiments may provide significant advantages as compared to a general composition used for an encapsulant.

In particular, a general encapsulant composition may include an organosiloxane that is cured, e.g., by acid-catalyzed condensation reactions between silanol groups bonded to organosiloxane components, or by metal catalyzed hydrosilylation reactions between silicon-bonded alkenyl groups and silicon-bonded hydrogen groups of organosiloxane components. Because of a slow curing reaction in acid-catalyzed condensation, the second method may be preferred.

In the case of the metal-catalyzed hydrosilylation reaction, a general composition including at least four components may be used:
1) a linear diorganopolysiloxane;
2) a branched organopolysiloxane;
3) an organosiloxane having at least two silicon-bonded aryl groups and at least two silicon-bonded hydrogen atoms in one molecule; and
4) a hydrosilylation reaction catalyst.

In the general composition, the linear and branched organopolysiloxanes both contain silicon-bonded alkenyl groups, and the molar ratio of silicon-bonded hydrogen atoms to silicon-bonded alkenyl groups in the silicon-containing resin is an important factor to consider for formulation. In the general composition, linear diorganopolysiloxanes having a mass average molecular weight of at least 3,000 may be used to adjust the viscosity of the resultant composition. However, the vinyl content of the linear diorganopolysiloxane is directly related to the M.w. of the polymer. Thus, when the M.w. of the polymer is increased, the vinyl content of the polymer is decreased and the viscosity of the polymer is increased. Conversely, when the M.w. of the polymer is decreased, the vinyl content of the polymer is increased and the viscosity of the polymer is decreased. As such, this limitation of the linear diorganopolysiloxane significantly narrows the process window for making polymers with different viscosity and vinyl content. For example, a polymer with high viscosity and high vinyl content may be needed. However, the intrinsic property of the linear polymer does not allow obtaining both high vinyl content and high viscosity.

In contrast to the general composition just described, embodiments of the present invention described herein provide for control of the M.w., viscosity, and vinyl content. In an implementation, an organopolysiloxane copolymer using a small quantity of, e.g., a hexafunctional arylene silyl monomer, may be used to adjust the viscosity of the final formulation. In contrast to the general composition that uses a linear copolymer, embodiments may employ a partially branched polymer, which may be a star shape polymer. According to the embodiments described herein, addition of very small quantity of a monomer corresponding to Chemical Formula 1, e.g., a hexafunctional arylene silyl monomer, to the synthetic procedure may not only provide a solution to obtain a wide range of functional copolymers with different M.w., but may also provide a solution to increase both the viscosity and particularly the vinyl content of the final copolymer, which is not possible in case of linear organopolysiloxane copolymers. That is, whereas the linear polymer exhibits a decrease in vinyl content when M.w. and viscosity are increased, embodiments of the present invention provide a solution to widen the process window and offer a full range of polymers with different viscosity and vinyl content.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A resin composition comprising a polysiloxane, the polysiloxane including a moiety represented by the following Chemical Formula 1:

*—Si-AR—Si—*  [Chemical Formula 1]

wherein, in the Chemical Formula 1, AR is or includes a substituted or unsubstituted C6 to C30 arylene group, and wherein the polysiloxane includes:
a moiety represented by the following Chemical Formula 2a,
a moiety represented by the following Chemical Formula 2b, and
at least one of moieties represented by the following Chemical Formulae 2c, 2d, and 2e:

$(OR^I)_a O_{(3-a)/2}Si-AR-SiO_{(3-b)/2}(OR^{II})_b$  [Chemical Formula 2a]

$R^1R^2SiO_{(2-c)/2}(OR^{III})_c$  [Chemical Formula 2b]

$R^3SiO_{(3-d)/2}(OR^{IV})_d$  [Chemical Formula 2c]

$R^4R^5SiO_{(2-e)/2}(OR^V)_e$  [Chemical Formula 2d]

$R^6R^7R^8SiO_{1/2}$  [Chemical Formula 2e]

wherein, in the Chemical Formulae 2a to 2e, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, and a, b, and d are independently from 0 to 2, and c and e are independently from 0 to 1.

2. The resin composition of claim 1, wherein the polysiloxane is represented by the following Chemical Formula 3:

$(R^6R^7R^8SiO_{1/2})_m[(OR^I)_a O_{(3-a)/2}Si-AR-SiO_{(3-b)/2}(OR^{II})_b]_n[R^3SiO_{(3-d)/2}(OR^{IV})_d]_p[R^1R^2SiO_{(2-c)/2}(OR^{III})_c]_q[R^4R^5SiO_{(2-e)/2}(OR^V)_e]_r$  [Chemical Formula 3]

wherein, in the Chemical Formula 3, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, $0<m<0.9$, $0<n<0.2$, $0\leq p<0.9$, $0<q<0.9$, and $0\leq r<0.9$, and m+n+p+q+r=1, and a, b, and d are independently from 0 to 2, and c and e are independently from 0 to 1.

3. The resin composition of claim 2, wherein the polysiloxane is included in about 50 wt % or more, based on the total amount of the transparent resin composition.

4. The resin composition of claim 3, wherein the polysiloxane is included in about 50 to 99.9 wt %, based on the total amount of the transparent resin composition.

5. The resin composition as claimed in claim 1, wherein the AR in the Chemical Formula 1 is

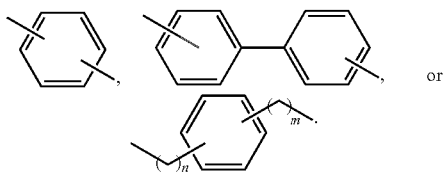

6. A transparent encapsulant obtained by curing a resin composition that includes a polysiloxane, the polysiloxane including a moiety represented by the following Chemical Formula 1:

*—Si—AR—Si—*  [Chemical Formula 1]

wherein, in the Chemical Formula 1, AR is or includes a substituted or unsubstituted C6 to C30 arylene group, and wherein the polysiloxane includes:
a moiety represented by the following Chemical Formula 2a,
a moiety represented by the following Chemical Formula 2b, and
at least one of moieties represented by the following Chemical Formulae 2c, 2d, and 2e:

$(OR^I)_a O_{(3-a)/2}Si-AR-SiO_{(3-b)/2}(OR^{II})_b$  [Chemical Formula 2a]

$R^1R^2SiO_{(2-c)/2}(OR^{III})_c$  [Chemical Formula 2b]

$R^3SiO_{(3-d)/2}(OR^{IV})_d$  [Chemical Formula 2c]

$R^4R^5SiO_{(2-e)/2}(OR^V)_e$  [Chemical Formula 2d]

$R^6R^7R^8SiO_{1/2}$  [Chemical Formula 2e]

wherein in the Chemical Formulae 2a to 2e, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d are independently from 0 to 2, and c and e are independently from 0 to 1.

7. The encapsulant of claim 6, wherein the polysiloxane is represented by the following Chemical Formula 3:

$(R^6R^7R^8SiO_{1/2})_m[(OR^I)_a O_{(3-a)/2}Si-AR-SiO_{(3-b)/2}(OR^{II})_b]_n[R^3SiO_{(3-d)/2}(OR^{IV})_d]_p[R^1R^2Si)_{(2-c)/2}(OR^{III})_c]_q[R^4R^5SiO_{(2-e)/2}(OR^V)_e]_r$  [Chemical Formula 3]

wherein in the Chemical Formula 3, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, $0<m<0.9$, $0<n<0.2$, $0\leq p<0.9$, $0<q<0.9$ and $0\leq r<0.9$, and $m+n+p+q+r=1$, and a, b, and d are independently from 0 to 2, and c and e are independently from 0 to 1.

8. An electronic device, comprising:

a light emitting and semiconducting element; and a transparent encapsulant surrounding the light emitting element, wherein the encapsulant is obtained by curing a resin composition that includes a polysiloxane, the polysiloxane including a moiety represented by the following Chemical Formula 1:

*—Si—AR—Si—*  [Chemical Formula 1]

wherein, in the Chemical Formula 1, AR is or includes a substituted or unsubstituted C6 to C30 arylene group, and wherein the polysiloxane includes:

a moiety represented by the following Chemical Formula 2a, a moiety represented by the following Chemical Formula 2b, and at least one of moieties represented by the following Chemical Formulae 2c, 2d, and 2e:

$(OR^I)_aO_{(3-a)/2}Si—AR—SiO_{(3-b)/2}(OR^{II})_b$ [Chemical Formula 2a]

$R^1R^2SiO_{(2-c)/2}(OR^{III})_c$ [Chemical Formula 2b]

$R^3SiO_{(3-d)/2}(OR^{IV})_d$ [Chemical Formula 2c]

$R^4R^5SiO_{(2-e)/2}(OR^V)_e$ [Chemical Formula 2d]

$R^6R^7R^8SiO_{1/2}$ [Chemical Formula 2e]

wherein in the Chemical Formulae 2a to 2e, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, a, b, and d independently are from 0 to 2, and c and e are from 0 to 1.

9. The electronic device of claim 8, wherein the polysiloxane is represented by the following Chemical Formula 3:

$(R^6R^7R^8SiO_{1/2})_m[(OR^I)_aO_{(3-a)/2}Si-AR-SiO_{(3-b)/2}(OR^{II})_b]_n[R^3SiO_{(3-d)/2}(OR^{IV})_d]_p[R^1R^2SiO_{(2-c)/2}(OR^{III})_c]_q[R^4R^5SiO_{(2-e)/2}(OR^V)_e]_r$ [Chemical Formula 3]

wherein, in the Chemical Formula 3, $R^I$ to $R^V$ are independently hydrogen or a substituted or unsubstituted C1 to C10 alkyl group, $R^1$ to $R^8$ are independently a substituted or unsubstituted C1 to C10 alkyl group, a substituted or unsubstituted C3 to C20 cycloalkyl group, a substituted or unsubstituted C1 to C10 hydroxyalkyl group, a substituted or unsubstituted C6 to C20 aryl group, a substituted or unsubstituted C2 to C20 heteroaryl group, a substituted or unsubstituted C2 to C10 alkenyl group, a substituted or unsubstituted C1 to C10 alkoxy group, a lactone group, a substituted or unsubstituted carboxyl group, a substituted or unsubstituted glycidylether group, a hydroxyl group, or a combination thereof, $0<m<0.9$, $0<n<0.2$, $0\leq p<0.9$, $0<q<0.9$ and $0\leq r<0.9$, and $m+n+p+q+r=1$, and a, b, and d are independently from 0 to 2, and c and e are independently from 0 to 1.

10. The electronic device of claim 8, wherein the electronic device includes at least one of a light emitting diode, an organic light emitting and semiconducting element, and a photoluminescent device.

* * * * *

UNITED STATES PATENT AND TRADEMARK OFFICE
CERTIFICATE OF CORRECTION

| | | |
|---|---|---|
| PATENT NO. | : 8,643,200 B2 | Page 1 of 1 |
| APPLICATION NO. | : 13/106353 | |
| DATED | : February 4, 2014 | |
| INVENTOR(S) | : Shahrokh Motallebi et al. | |

It is certified that error appears in the above-identified patent and that said Letters Patent is hereby corrected as shown below:

On the Title Page of the patent, item (73) should read as first line;

(73) Assignee: Cheil Industries, Inc., Gumi-si

Signed and Sealed this
Fifteenth Day of July, 2014

Michelle K. Lee
*Deputy Director of the United States Patent and Trademark Office*